US010613119B2

(12) United States Patent
Carson et al.

(10) Patent No.: US 10,613,119 B2
(45) Date of Patent: Apr. 7, 2020

(54) VOLTAGE MEASUREMENT AND WIRELESS COMMUNICATION SYSTEM

(71) Applicant: Hubbell Incorporated, Shelton, CT (US)

(72) Inventors: Michael David Carson, New York, NY (US); John Edward Brower, Redding, CT (US); Joseph Neuhaus Dowdell, Danbury, CT (US)

(73) Assignee: Hubbell Incorporated, Shelton, CT (US)

( * ) Notice: Subject to any disclaimer, the term of this patent is extended or adjusted under 35 U.S.C. 154(b) by 47 days.

(21) Appl. No.: 15/738,360

(22) PCT Filed: Jun. 29, 2016

(86) PCT No.: PCT/US2016/040061
§ 371 (c)(1),
(2) Date: Dec. 20, 2017

(87) PCT Pub. No.: WO2017/004182
PCT Pub. Date: Jan. 5, 2017

(65) Prior Publication Data
US 2018/0180648 A1 Jun. 28, 2018

Related U.S. Application Data

(60) Provisional application No. 62/188,283, filed on Jul. 2, 2015.

(51) Int. Cl.
*G01R 15/14* (2006.01)
*H04Q 9/00* (2006.01)
(Continued)

(52) U.S. Cl.
CPC ........... *G01R 15/144* (2013.01); *G01R 15/04* (2013.01); *G01R 15/26* (2013.01); *G08B 5/36* (2013.01);
(Continued)

(58) Field of Classification Search
CPC combination set(s) only.
See application file for complete search history.

(56) References Cited

U.S. PATENT DOCUMENTS 5,006,846 A 4/1991 Granville et al.
6,617,840 B2 9/2003 Bierer
(Continued)

OTHER PUBLICATIONS

International Search Report dated Nov. 16, 2016 which issued in PCT Patent Application No. PCT/US2016/040061.

*Primary Examiner* — Jay Patidar
(74) *Attorney, Agent, or Firm* — Dickinson Wright PLLC

(57) ABSTRACT

A voltage measurement system has a voltage measuring device connected to a device under test by a voltage divider to drop high voltages (e.g., peaking at or above 100 kilovolts) at a measurement point to lower levels for processing by a voltage measurement and wireless printed circuit board. The voltage measuring device communicates raw measurement data wirelessly (e.g., via Bluetooth®) to a remote device such as a mobile phone, laptop or portable meter head having a display and processing device programmed to calculate voltage measurements such has absolute average (ABS AVG), AC root mean square (RMS), +/−peak voltage, and AC or DC coupling. The remote device can wirelessly communicate with multiple voltage measuring devices to capture raw measurement data therefrom for voltage measurement applications with multiple measurement points (e.g., three-phase measurement, and transformer testing).

11 Claims, 12 Drawing Sheets

(51) Int. Cl.
*G01R 15/04* (2006.01)
*G08B 5/36* (2006.01)
*G01R 15/26* (2006.01)
*G01R 15/06* (2006.01)
*G01R 13/02* (2006.01)
*G01R 19/02* (2006.01)
*G01R 19/04* (2006.01)

(52) U.S. Cl.
CPC ........... *H04Q 9/00* (2013.01); *G01R 13/0209* (2013.01); *G01R 13/0218* (2013.01); *G01R 15/06* (2013.01); *G01R 19/02* (2013.01); *G01R 19/04* (2013.01); *H04Q 2209/43* (2013.01); *H04Q 2209/84* (2013.01)

(56) References Cited

U.S. PATENT DOCUMENTS

| | | | |
|---|---|---|---|
| 6,734,658 B1 * | 5/2004 | Bierer | G01R 15/14 324/107 |
| 8,059,006 B2 | 11/2011 | Schweitzer, III et al. | |
| 8,665,102 B2 | 3/2014 | Salewske et al. | |
| 2013/0069627 A1 | 3/2013 | Cs et al. | |
| 2014/0207399 A1 | 7/2014 | Roberson | |

* cited by examiner

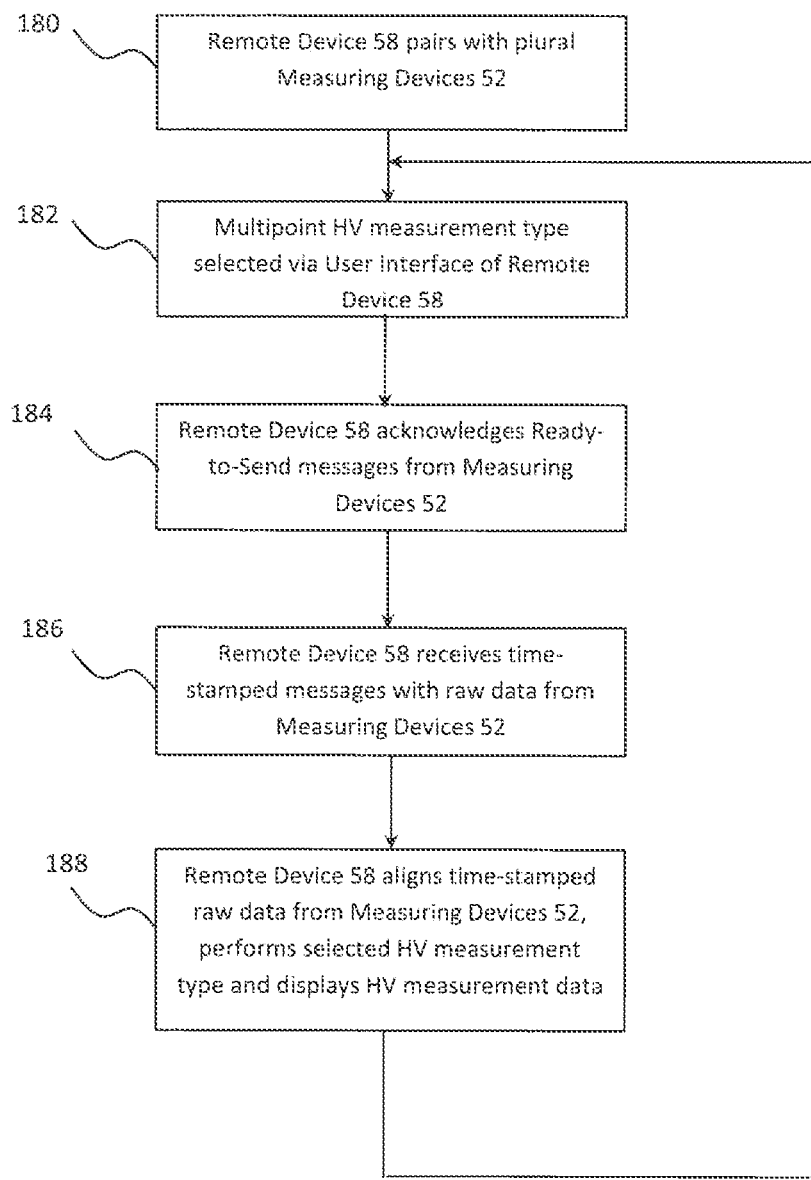

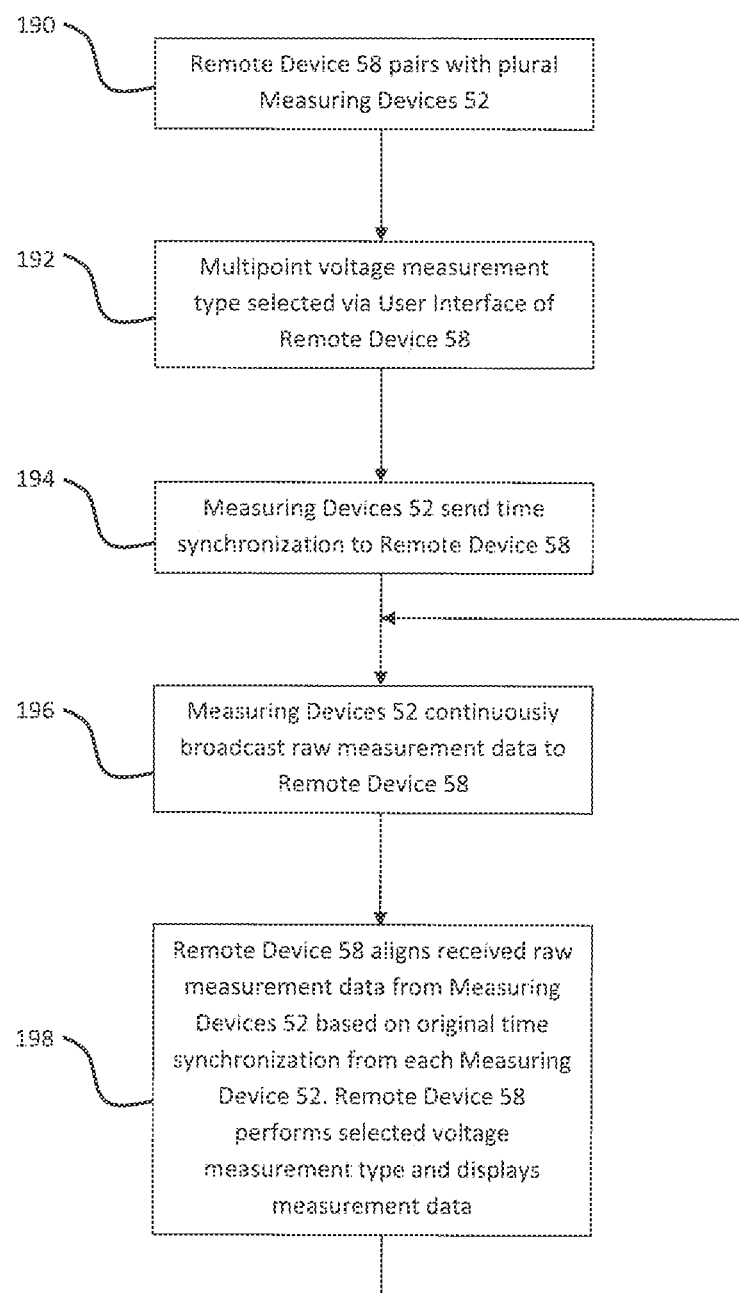

VOLTAGE MEASUREMENT AND WIRELESS COMMUNICATION SYSTEM

FIELD OF THE INVENTION

The present invention relates generally to a voltage measurement system. More particularly, the present invention relates to a voltage measurement system with wireless communication between a measuring device and a remote device with display.

BACKGROUND OF THE INVENTION

As used herein, high voltage (HV) shall refer to transmission voltages (e.g., between 115 kilovolts (kV) and 750 kV) or voltages on the order of at least 100 kV or more such as 100's of kilovolts, as compared to lower distribution voltages. For example, electric power distribution systems carry electricity from a power generation and transmission system to individual consumers. A power transmission system operates at a significantly higher voltage range than a power distribution system. For example, components in a transmission system operate at voltages ranging between 115 kilovolts (kV) and 750 kV. Distribution substations, on the other hand, connect to the transmission system and lower distribution voltages ranging between 5 kV-69 kV to medium voltages ranging between 2 kV and 35 kV with the use of transformers. Distribution transformers are located near customers' premises. Primary distribution lines carry the medium voltage power to distribution transformers, which further lower the voltage to utilization voltage of household appliance. Accordingly, as used herein, high voltage (HV) shall be understood to refer to transmission voltages (e.g., between 115 kV and 750 kV or voltages on the order of at least 100 kV or more such as 100's of kilovolts), which are typically higher than distribution voltages.

With reference to FIG. 1, a system 10 for measuring high voltages on the order of 100-500 kV, for example, can use a measuring device 12 having a large resistive or capacitive divider 20 to bring down the voltage of the device under test 18 to a lower voltage (e.g., on the order of +/−100 V). An example system is a KVM Series AC/DC kilovoltmeter available from HAEFELY HIPOTRONICS in Brewster, N.Y. having different models with different sizes of dividers 20 for measuring various ranges of voltages such as 0-100 kV, 0-200 kV, 0-300 kV and 0-400 kV. This large divider 20 is then wired to a display circuit 16 via a signal-conditioning board 22 comprising a small divider. In the display circuit 16, the voltage signal is buffered and conditioned using passive components. The display circuit 16 is usually either a meter or a seven segment display, which can show several types of measurements such as, for example, average or root mean square (RMS) voltage ($V_{rms}$), +/−peak voltage ($V_{pp}$) and AC/DC coupling, by switching mechanically between different analog circuit paths that connect to the display. Two types of selection knobs are provided on these meter heads 16, that is, a knob for AC or DC selection, and a mechanical dial to switch between the respective analog circuit paths for the different measurement types supported by the meter 16.

The line 14 connecting the measuring device 12 with the display device or meter 16 is disadvantageous for a number of reasons. For example, the line 14 provides a conductive connection containing high voltages from the measuring device 12 to the display device 16 where a user will be, thereby exposing the user to an electrical shock hazard since the user's distance from the high voltages is limited by the wire length (e.g., on the order of only 6 meters).

Existing meters for high voltage measurements have different features depending on the particular application. These meters may be used for voltage detection, phase measurement, phase sequence identification, and/or testing for induced or live power lines or equipment. For the testing or calibration of high voltage equipment (e.g., AC/DC Hipot testers and High Voltage DC power supplies), inadequate lighting and distance from the device under test 18 and measuring device 12 to the meter head 16 with display can make reading the numbers on the meter head display very difficult.

The cable connections 14 of voltage probes of conventional high voltage measurement systems present a further inconvenience because such cables 14 make the handling of a measuring device 12, and particularly the handling of plural measuring devices 12 (e.g., such as in a phase measurement test), cumbersome and time consuming. For example, using existing KVM100s for multipoint measurements (e.g., 3-phase power system measurements, or measurements of the primary and secondary sides of a HV transformer) requires a separate instrument and hardwired display at each point of measurement and the associated cabling, which is cumbersome. Further, a user would need to use a HOLD function to capture plural measurements at different points at a particular time, or use cumbersome, custom-made data acquisition equipment hardwired to each device at each test point. Either method presents, however, safety issues in terms of user proximity to the test point and hardwired device.

Accordingly, there is a need for wireless voltage measurement devices and wireless meter heads or other data display devices for voltage measurements (e.g., measurements of voltages peaking in a high voltage range of 100 kV to 500 kV, as well as lower voltages peaking in a medium voltage range of 15 kV to 69 kV), so that voltages can be measured at remote locations and data can be collected and displayed wirelessly and therefore more safely and conveniently without need for cumbersome cabling such as, for example, the illustrative cabling 14 between the measurement device 12 and the meter head with display 16 in FIG. 1. A need also exists for an improved voltage measurement system having wireless measurement devices and a wireless data display device(s) that more conveniently measures, collects and displays voltage measurement data from multiple locations. The improved voltage measurement system can be used with essentially any voltage measurement applications and equipment. Further, examples of high or medium voltage measurement applications and equipment or apparatuses with which the improved voltage measurement system can be used include, but are not limited to, testing motors (e.g., in a hydrocenter) or cables (e.g., in a factory) or transformers that are intended for high or medium voltage operation. Multiple location voltage measurements can be, but are not limited to, three-phase cable testing, testing phase balance or three-voltage measurements on motor terminals, or testing primary and secondary windings of a transformer, for example.

SUMMARY OF THE INVENTION

Illustrative embodiments of the present invention address at least the above problems and/or disadvantages and provide at least the advantages described below. In accordance with an object of illustrative embodiments of the present invention, a wireless voltage measurement system and related devices are provided.

According to an embodiment of the present invention, a system for voltage measurement and wireless communication is provided that comprises a voltage divider connected to a device under test (DUT) and configured to step down voltage signals from the (DUT) peaking at least at 100 kilovolts (kV) or above to lower voltages on the order of +/−100V; and a measuring device connected to the voltage divider for receiving raw measurement data comprising stepped down voltage signals from the voltage divider. The measuring device comprises a processing device and wireless transceiver, and the processing device is configured to condition the stepped down voltage signals for wireless transport via the wireless transceiver in accordance with a wireless communication protocol.

In accordance with an aspect of illustrative embodiments of the present invention, the system for voltage measurement and wireless communication further comprises at least one remote device configured for remote operation from the measuring device and voltage divider. The remote device comprises a remote processing device, a remote transceiver and a display. The remote processing device is configured to control the remote transceiver to communicate with the transceiver in the measuring device to receive the wirelessly transmitted signals comprising the raw measurement data, store the raw measurement data, operate a user interface to receive user inputs to select from among a plurality of voltage measurements, determine the selected voltage measurement using the raw measurement data, and output the voltage measurement on the display. The plurality of voltage measurement types can comprise, but are not limited to absolute average (ABS AVG), alternating current (AC) root mean square (RMS), peak+voltage, peak−voltage, frequency, phase angle, AC coupling, and direct current (DC) coupling.

In accordance with other aspects of illustrative embodiments of the present invention, the transceiver and the remote transceiver are configured to communicate using at least one of ZigBee®, Bluetooth® and WiFi. Further, the remote device is configured to determine when one or more of the measuring device is within a designated wireless communication range.

In accordance with an aspect of illustrative embodiments of the present invention, the remote device is configured to receive signals from a plurality of the measuring devices. For example, the wirelessly transmitted signals can comprise at least an identifier corresponding to the measuring device, and the remote device can be configured to store the raw measurement data in the received signals in a memory device such that it is attributed to the measuring device assigned the identifier. Further, the wirelessly transmitted signals can be associated with a time stamp. If one of the plurality of voltage measurements uses the raw measurement data transmitted from a plurality of selected measuring devices, the remote processing device can be configured, for example, to determine which raw measurement data corresponds to the plurality of selected measuring devices for at least one of a selected period of time or initiation of a selected voltage measurement using the time stamps and identifiers.

In accordance with additional aspects of illustrative embodiments of the present invention, wherein the remote device is configured to receive signals from a plurality of the measuring devices, the remote processing device is configured to determine when a measuring device is within range to receive signals therefrom via the remote transceiver, and to display all measuring devices determined to be within range. The user interface can be configured to allow a user to select one or more of the displayed measuring devices determined to be within range. Further, the remote processing device can be configured to display at least one of raw measurement data and a voltage measurement for each of the measuring devices on the display.

In accordance with an aspect of illustrative embodiments of the present invention, each measuring device comprises a visual indicator that is operated to illuminate when the measuring device is paired with the remote device for wireless communication and to discontinue illumination when the measuring device is not paired with the remote device for wireless communication. For example, the visual indicator can be a multicolor indicator that is controlled to illuminate a selected color, and the visual indicators of the measuring devices can be controlled to illuminate different colors. In addition, the display of the remote device outputs at least one of an identifier, raw measurement data, and an voltage measurement corresponding to at least one of the measuring devices using its respective one of the different colors.

Objects, advantages and salient features of the invention will become apparent to those skilled in the art from the following detailed description, which, taken in conjunction with annexed drawings, discloses exemplary embodiments of the invention.

BRIEF DESCRIPTION OF THE DRAWINGS

The above and other example features and advantages of certain exemplary embodiments of the present invention will become more apparent from the following description of certain illustrative embodiments thereof when taken in conjunction with the accompanying drawings, in which:

FIGS. 11 and 12 are flow charts of operations of the wireless meter and the voltage measurement devices of FIG. 8 in accordance with respective illustrative embodiments of the present invention.

Throughout the drawings, like reference numerals will be understood to refer to like elements, features and structures.

DETAILED DESCRIPTION OF ILLUSTRATIVE EMBODIMENTS

The matters exemplified in this description are provided to assist in a comprehensive understanding of illustrative embodiments of the invention, and are made with reference to the accompanying figures. Accordingly, those of ordinary skill in the art will recognize that various changes and modifications of the illustrative embodiments described herein can be made without departing from the scope of the claimed invention. Also, descriptions of well-known functions and constructions are omitted for clarity and conciseness.

Figure 1:
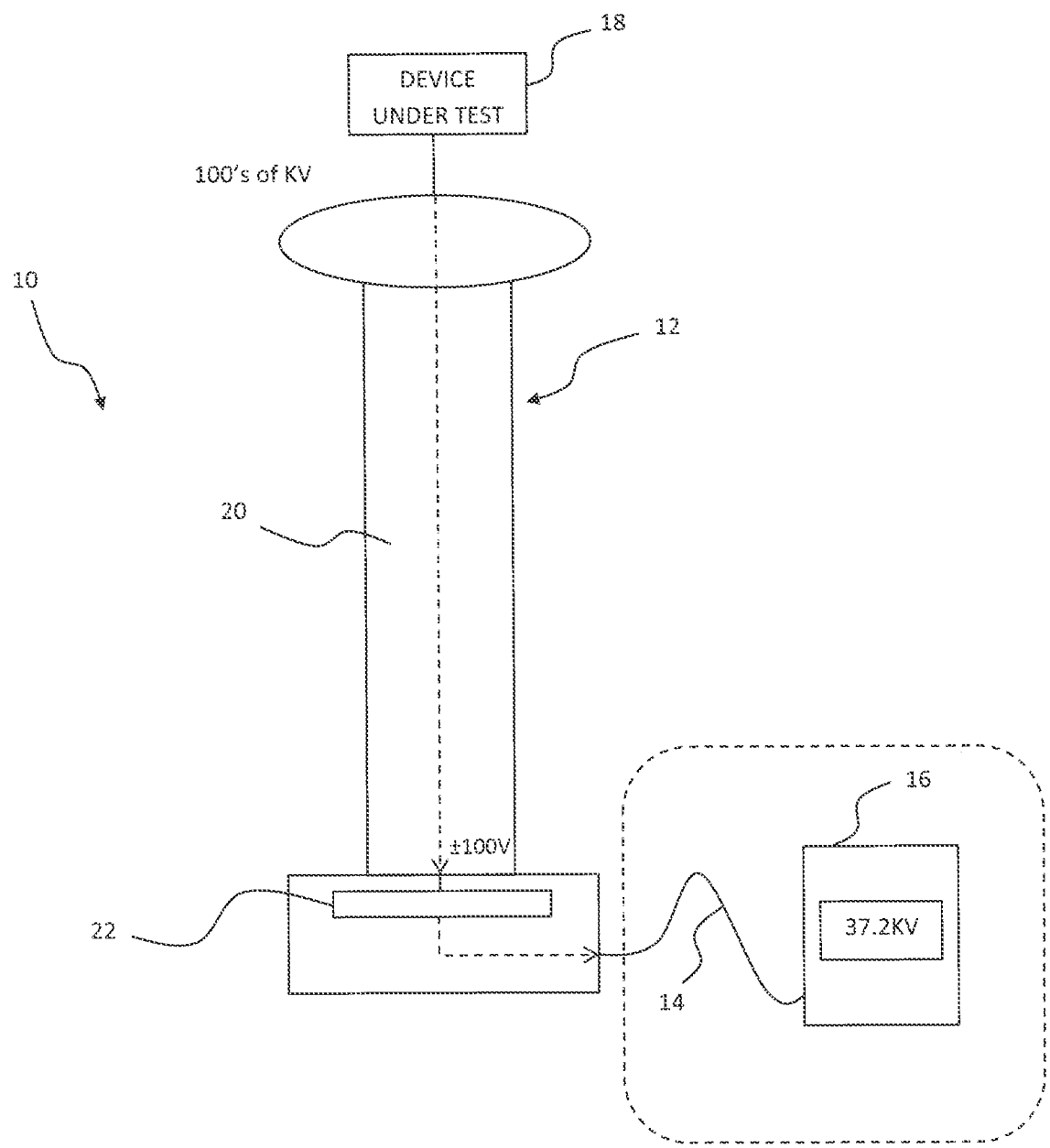
FIG. 1 depicts a voltage measurement system.
Figure 2:
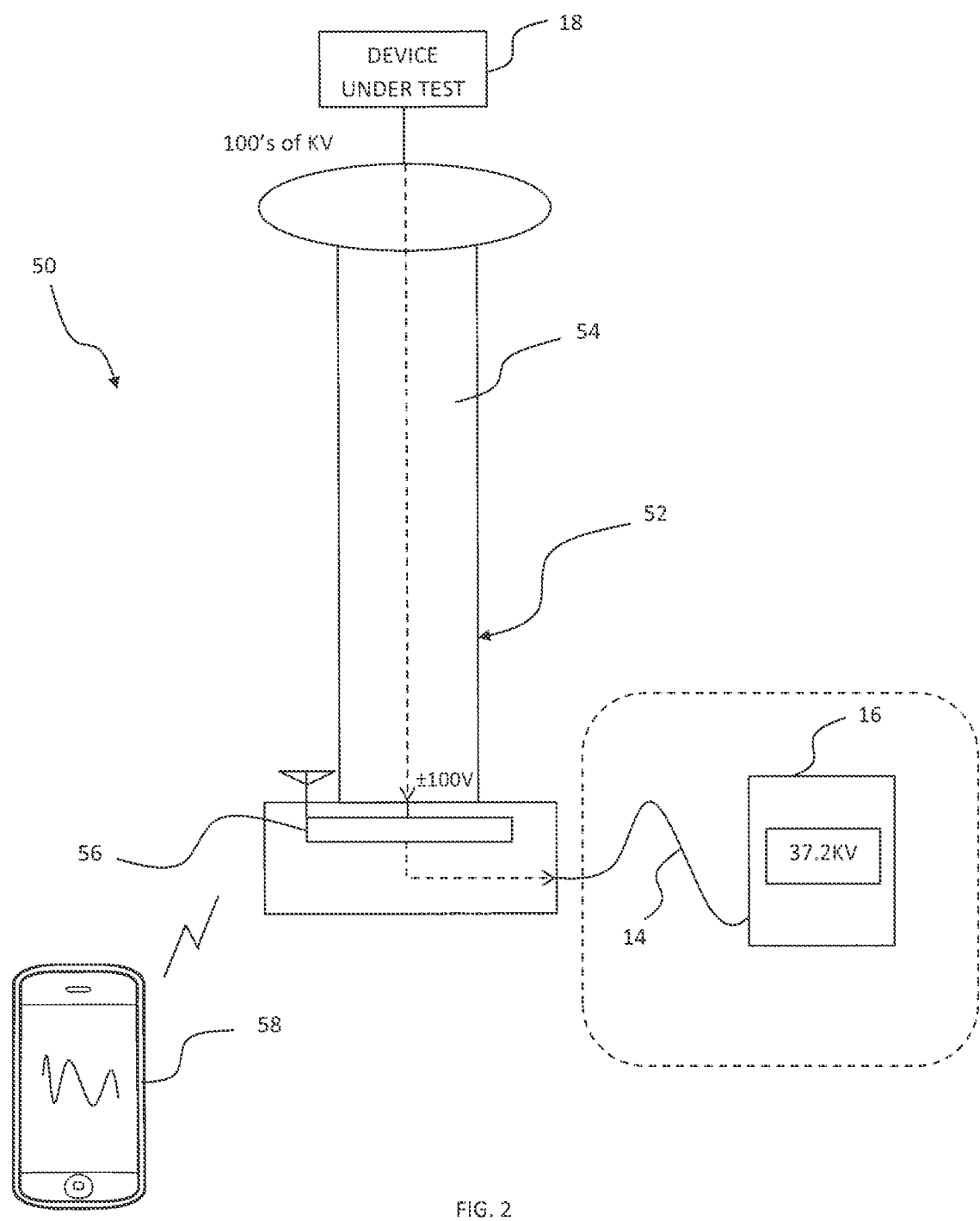
FIG. 2 depicts a voltage measurement system constructed in accordance with an illustrative embodiment of the present invention.

In accordance with an illustrative embodiment of the present invention and with reference to FIG. 2, an improved voltage measurement system 50 comprises a measuring device 52 connected to a device under test 18 by a voltage divider 54 configured to step down measured voltages (e.g., peaking at 100 kV-500 kV among other high or medium voltages) to lower voltages on the order of +/−100 V. The measuring device 52 has a voltage measurement and wireless printed circuit board (PCB) 56 configured to further step down the lower voltages of the raw measurement data (e.g., on the order of +/−100 V) to even lower voltages (e.g., 5 V) for buffering and processing by a microcontroller or other processing device for wireless transmission to a remote user device or meter head 58. The voltage measurement and wireless PCB 56 can also be provided with a connector (e.g., a BNC connector) for optionally connecting the measuring device 52 to a conventional meter 16 via a cable 14.

The improved voltage measurement system 50 realizes a number of advantages. First, the end user is protected by the wireless link between the measuring device 52 and the meter head 58 since there is no direct conductive connection to the voltage source. That is, there are no wires or cable 14 leading from the device under test 18 to the vicinity of the user (e.g., to the meter head unit with display 58) that could conduct voltages (e.g., medium or high voltages) in a mode of failure. The wireless design of the measuring system 50 is safer and more convenient than previous voltage measurement systems since the user can operate the wirelessly connected end user device with display 58 (e.g., a portable computing device, laptop, cell phone, portable meter, and so on) while maintaining a greater distance away from the device under test 18, the measuring device 52 and the associated voltages (e.g., particularly medium and high voltages). Further, the voltage measurement and wireless PCB 56 is configured to suppress high voltage transients and electromagnetic interference (EMI) using components such as transient voltage Suppressors (TVS), varistors, and voltage-limiting Diodes) and other transient protection devices known to those with skill in the art.

Figure 3:
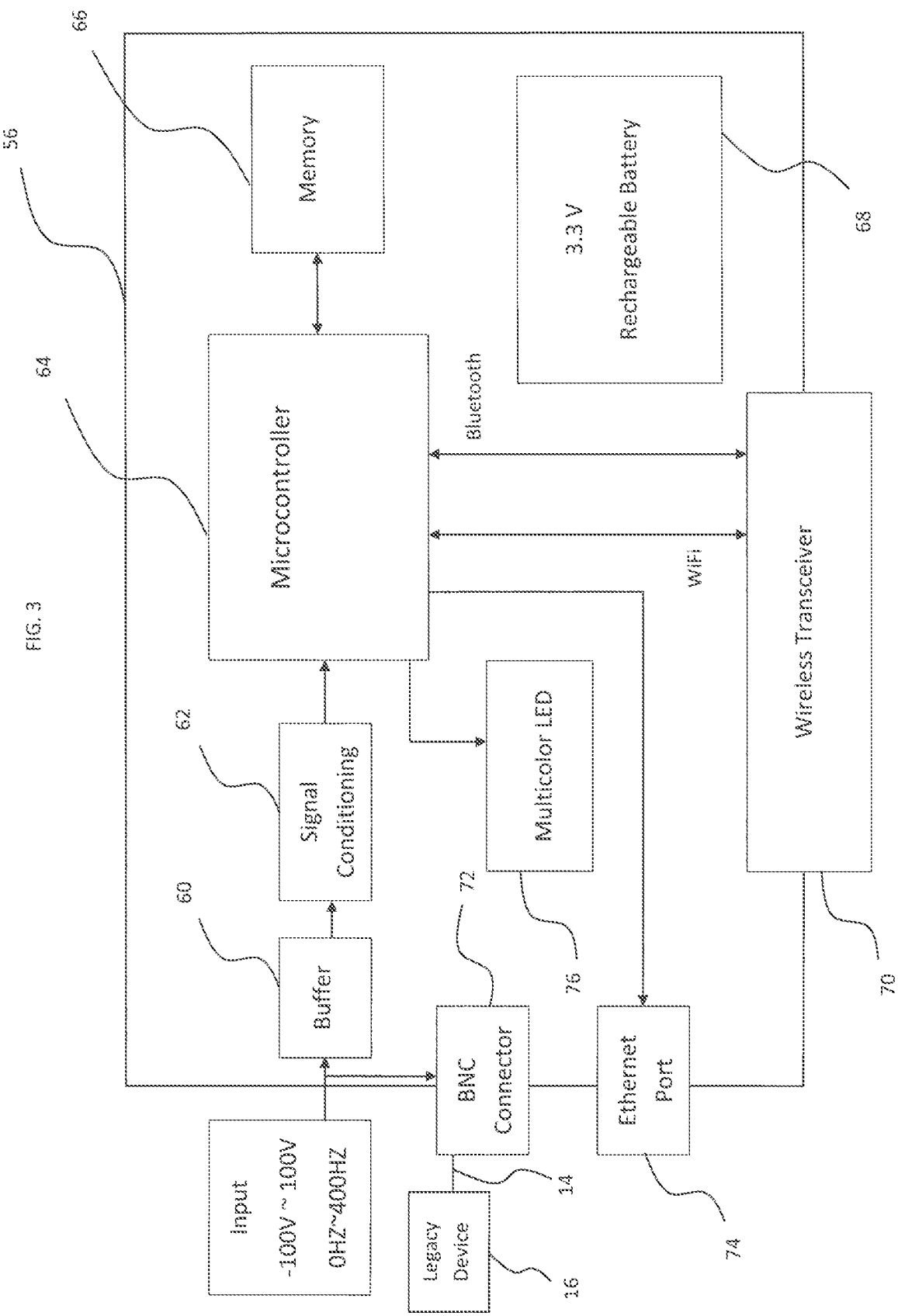
FIG. 3 is a block diagram of a wireless printed circuit board deployed at a voltage divider in the voltage measurement system of FIG. 2.

An example voltage measurement and wireless PCB 56 is depicted in FIG. 3 and constructed in accordance with an illustrative embodiment of the present invention. As illustrated in FIG. 3, the voltage measurement and wireless PCB 56 is mounted or otherwise provided at the bottom of the larger divider 54. As stated previously, the larger divider 54 is configured to receive raw measurement data comprising a voltage signal (e.g., a medium voltage, or high voltage on the order of at least 100 kV or 100's of kilovolts such as 100 kV-500 kV) and step it down to a lower voltage on the order of +/−100 V. The voltage measurement and wireless PCB 56 comprises a buffer 60 for the input voltage signal (e.g., between −100 V and +100 V and approximately 0 Hz-400 Hz) and a signal conditioning device 62 to condition the voltage signal (e.g., to step down the voltage further such as to on the order of −3.3 V to +3.3 V) before supplying it to electronic components (e.g., a microcontroller 64, digital memory 66 and transceiver 70) that might be damaged by higher voltages. The output of the signal conditioning device 62 is provided to an analog-to-digital converter (ADC) which can be a separate component at the input of the microcontroller 64 or an integrated component of the microcontroller 64. The microcontroller 64 processes the raw measurement data digitized by the ADC and wirelessly transmits the raw measurement data (e.g., as data packets) via a wireless transceiver 70 to a remote device 58 (i.e., a tablet, mobile phone, computer, laptop, or other device with a processor programmed or otherwise configured to determine different types of voltage measurements such as AC RMS, DC, absolute average (ABS AVG), crest factor, peak (+) voltage, peak(−) voltage, DC or AC coupling, frequency and so on), and an optional display or at least memory to store a data log of voltage measurement data. The microcontroller 64 can be another type of processing device such as, for example, a microprocessor or other programmable semiconductor chip, or a programmable gate array (e.g., an FPGA) or an application-specific integrated circuit (ASIC).

Different types of measurements are processed via software in the microcontroller 64 or end device 58, for example, and the user selects the desired output on the display of the end device 58, for example. For example, raw measurement data that has been averaged over a designated time interval can be received from the measuring devices 52, and the end device 58 can be programmed to compute values for at least one or more of the following measurement types:

DC: measurement of the average value of the direct current component of any voltage waveform over a period of approximately 0.2 seconds; the coupling must be set to DC or OFF to use this mode of measurement;

ABS AVG: averaging the absolute value of the waveform over approximately 0.2 seconds;

AC RMS: calculation of the true RMS voltage over approximately 0.2 seconds;

Peak+/−: capture of the highest/lowest excursion of the waveform over 5 cycles;

Frequency: calculation of the frequency of the waveform;

Crest Factor: $V_{peak}/V_{RMS}$.

The voltage measurement and wireless PCB 56 can also be optionally provided with a unity-gain connector (e.g., a BNC connector 72), which allows for backwards-compatibility (e.g., output of measurement signals via cable 14 or other hardwire connection to a legacy meter head 16 that lacks wireless transmission capability). In addition, the voltage measurement and wireless PCB 56 comprises a memory 66 connected to the microcontroller 64 which can store programmed code for controlling the microcontroller, and store input raw measurement data (e.g., the conditioned voltage signal from the ADC) and optionally voltage measurement data (e.g., AC RMS, DC, ABS AVG, crest factor, peak+/−, or frequency) if calculated by the microcontroller 64 instead of the end device 58. A power source is also provided to the voltage measurement and wireless PCB 56 such as a 3.3 V rechargeable battery 68. It is understood that other power sources can be used to power the components of voltage measurement and wireless PCB 56 such as a power interface or adapter (e.g., micro USB).

As stated above and with continued reference to FIG. 3, the voltage measurement and wireless PCB 56 comprises a transceiver 70 for communicating wirelessly to, for example, a compatible transceiver 80 in each of one or more remote devices 58. Different methods of communication can be employed between the voltage measurement and wireless PCB 56 mounted to the bottom of the large resistive/capacitive divider 54 and the remote device 58 (e.g., an end user device with display) such as, but are not limited to, ZigBee®, WiFi and Bluetooth® (e.g., Bluegiga Technologies BLE112), with the option of Ethernet or Fiber communication, as well, for example. The voltage measurement and wireless PCB 56 can be configured with multiple measurement channels to allow for a second voltage measurement or an optional current/auxiliary measurement, for example.

Figure 8:
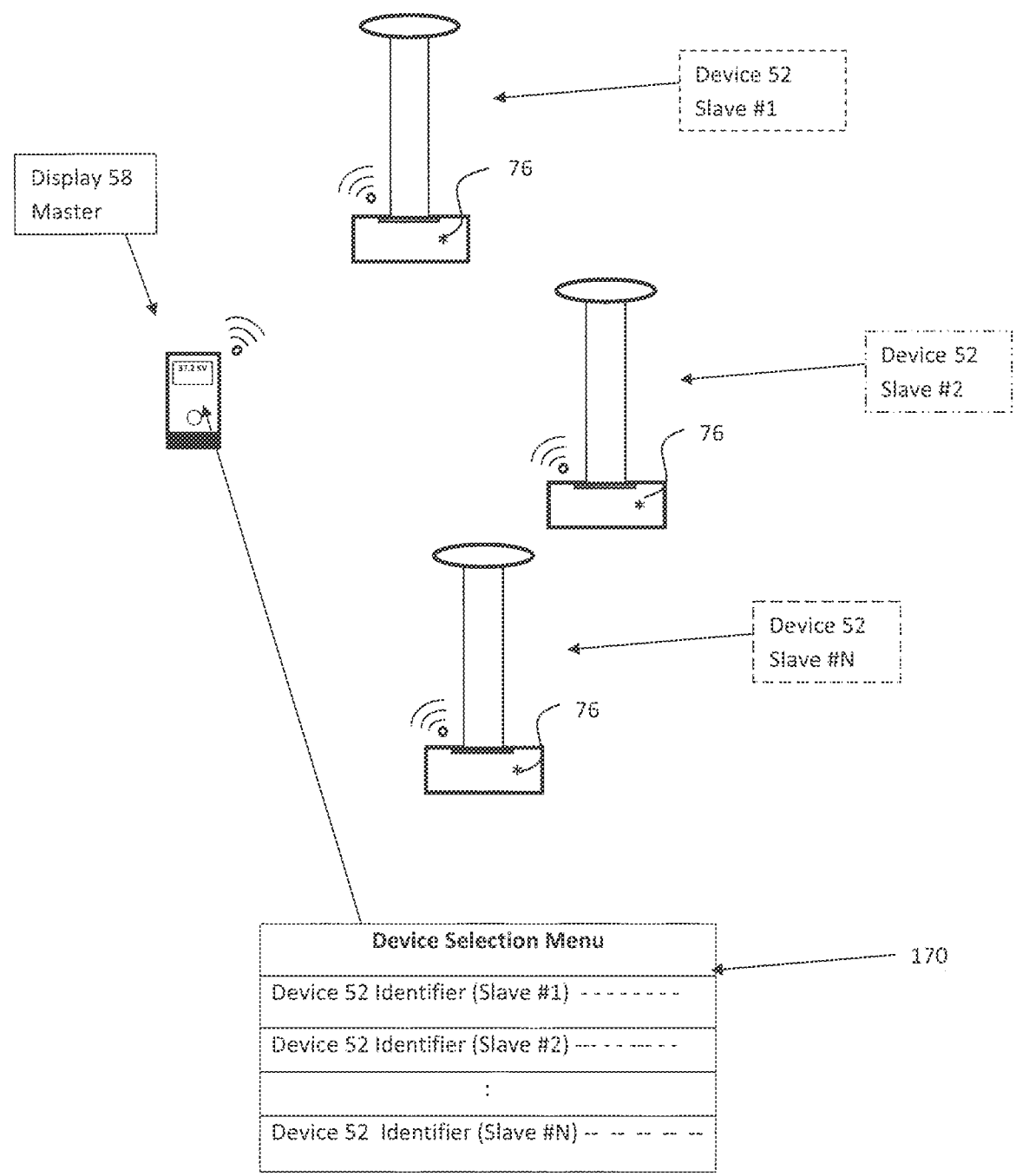
FIG. 8 depicts a plurality of voltage measurement devices of FIG. 2 deployed at respective test points and operating with a wireless meter of FIG. 2 in accordance with an illustrative embodiment of the present invention.

As illustrated in FIG. 8, the wireless display or end user's device 58 has the ability to communicate with several different measuring devices 52 (e.g., respective device under tests 18 or respective components of a device under test 18 and a measuring device 52 with voltage divider 54 at each of these measurement points) that are in range (e.g., within an operational wireless communication range depending on the wireless transmission method used). As stated above, the measuring devices 52 can be powered by a rechargeable battery provided on their corresponding voltage measurement and wireless PCBs 56.

Figure 4:
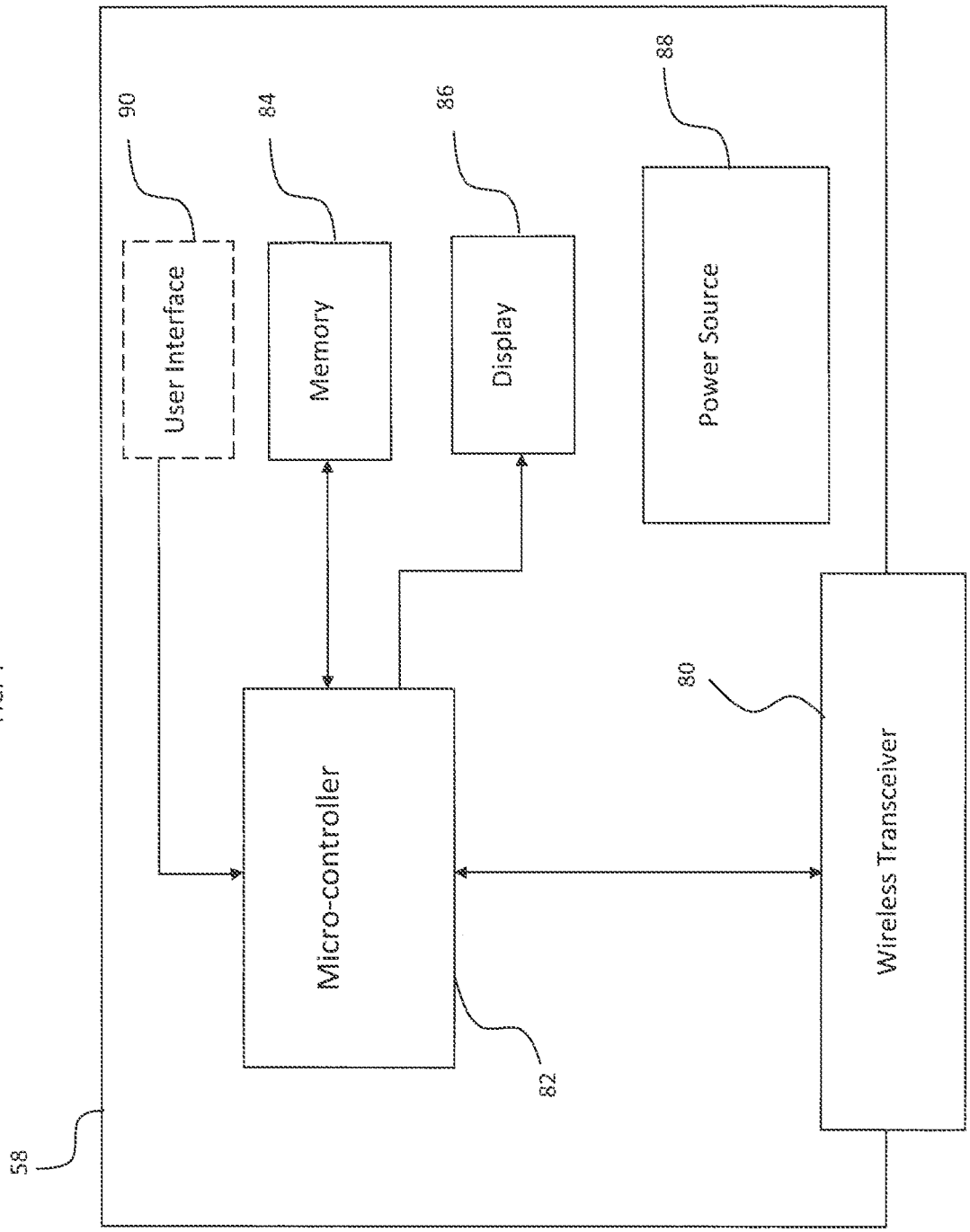
FIG. 4 is a block diagram of a wireless meter with display constructed in accordance with an illustrative embodiment of the present invention and operable in the voltage measurement system of FIG. 2.

With reference to FIG. 4, the remote device 58 is provided with a wireless transceiver 80 configured to communicate wirelessly with the wireless transceiver(s) 70 in each of one or more measuring devices 52. As stated above, the remote device 58 can be, but is not limited to, a portable computing device, laptop, cell phone, portable meter, a tablet or iPad, computer, or other device with a display 86 and processing device 82. For example, the processing device 82 can be a microcontroller or other programmable semiconductor chip, or a programmable gate array (e.g., an FPGA) or an application-specific integrated circuit (ASIC). The remote device 58 also comprises a memory 84, and a power source 88 such as a battery, or power interface or adapter (e.g., micro USB). Line power can also be used to power the remote device 58, for example. The memory 84 can store, for example, current and past raw measurement data from one or more voltage measurement systems 52 received at the remote device 58. The display 86 can be, for example, a touchscreen configured as a graphical user interface (GUI) to receive user inputs. A user can interface the remote device 58 via the GUI on the display 86 and/or user buttons, dials and/or switches provided by on optional user interface 90.

Figure 5:
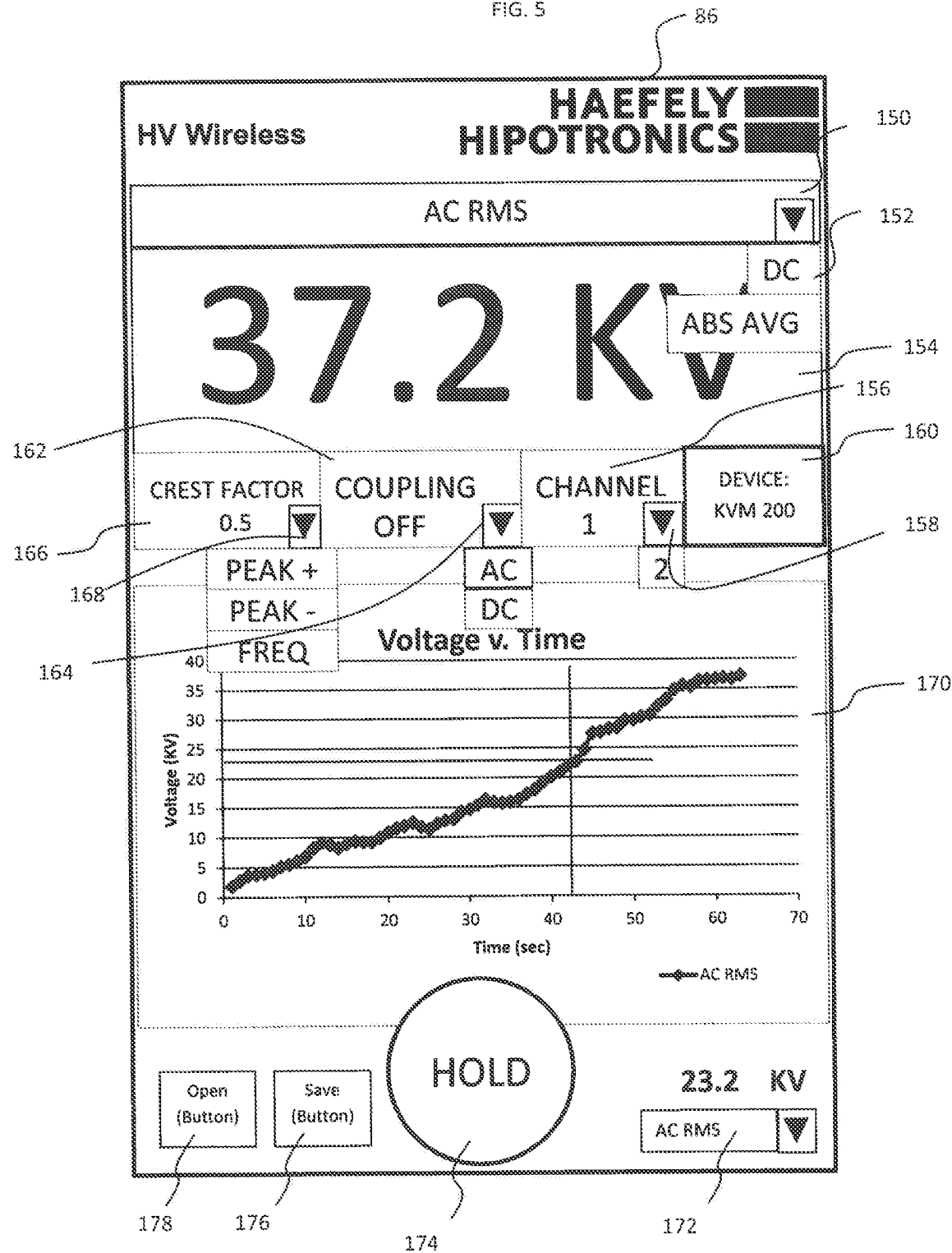
FIG. 5 depicts a graphical user interface of a wireless meter with display constructed in accordance with an illustrative embodiment of the present invention and operable in the voltage measurement system of FIG. 2.

With continued reference to FIG. 4 and in accordance with an illustrative embodiment of the present invention, a wireless voltage measurement application is provided to the processing device 82 to configure the remote device 58 to display a voltage measurement (e.g., selected from among a plurality of different available voltage measurements) and have the option to display a graph of the recent history of voltages as illustrated, for example, in FIG. 5. The wireless voltage measurement application can configure the processing device 82 to operate the display 86 to indicate user interface options such as, for example: (a) to select the different types of voltage measurements (e.g., absolute average (ABS AVG), AC root mean square (RMS), +/−peak voltage, and AC or DC coupling); (b) to select different connected devices 52; and (c) to select the different channels on each device 52. As stated above, different types of voltage measurements are processed via software in the microcontroller 64 or end device 58. For example, the transmitted raw measurement data received by the transceiver 80 that correspond to the voltage signals at the voltage divider 54 connected to the device under test 18 are processed via the wireless voltage measurement application on the processing device 82 to determine one or more of the above-mentioned different types of measurements (e.g., AC RMS, +/−peak voltage and so on), as selected via the user interface 86 and/or 90. The computed measurement values can be saved in the memory 84, for example, for the current continuous session and plotted in a graph indicating voltages over time on the display 86. It is to be understood that the remote device 58 does not necessarily have a display 86 but can nonetheless be used to collect raw measurement data, compute one or more types of voltage measurements (or receive them wirelessly if they are computed at the measuring device), and maintain a data log comprising stored measurement data that can be accessed directly by a user via the user interface 90 or accessed remotely by another computer device (e.g., the user interface 90 comprises a data communications interface for wired or wireless connectivity to another device such as the connection of a user device 58 to another user device 58 in FIG. 9).

As shown in FIG. 5, the GUI on the display 86 can be configured with a display area 150 indicating a type of voltage measurement (e.g., AC RMS) and a display area 154 indicating the current value representing that measurement (e.g., 37.2 kV). A GUI button (e.g., drop down menu or scroll) 152 can be used to change the type of voltage measurement displayed at 150 and 154 such as a DC coupling or ABS AVG measurement. A GUI display area 160 indicates an identifier (e.g., "DEVICE: N") of the voltage measurement system 50 currently providing the voltage signals from which selected voltage measurements are being determined and output by the remote device 58. As illustrated in FIG. 8, the display area 160 can also be a GUI input (e.g., a drop down menu, scroll or other search and selection button) to designate a voltage measurement system 50 selected from among a plurality of voltage measurement systems 50 (e.g., respective measuring devices 52 connected to corresponding devices under test 18 or to plural measurement points of a device under test 18). The menu or list of devices 52 can be, for example, preconfigured, or populated with the identifiers (e.g., serial numbers or names) of devices 52 discovered based on their transmitted signals comprising raw measurement data meeting a selected threshold of signal strength when received at the remote device 58. The signals for transmitting the raw measurement data can each comprise a device identifier corresponding to the measuring device 52 that transmitted the signal to the remote device 58. FIG. 8, for example, depicts an illustrative display area 170 on the display 86 in which a number of discovered measuring devices 52 are listed for selection (e.g., for display of voltage measurement data from that selected measuring device 52 in the display areas 154 and 170).

A display area 156 on the display indicates which of plural channels is currently having a measurement value indicated on the display 86, and can provide a GUI input (e.g., a drop down menu, scroll or other search and selection button) 158 for selecting from among plural channels (e.g., Channel 1 or 2) associated with a measuring device 52. For example, the ADC in the measuring device 52 can have two channels to provide for an auxiliary output for an auxiliary sensor such as a current probe or temperature sensor. Accordingly, the remote device 58 can be configured to provide a corresponding display function on display device 86 to show an output or measured value from the auxiliary sensor on a second channel as well as a voltage measurement from the primary measuring channel.

With continued reference to FIG. 5, a display area 162 indicates whether coupling is off (e.g., a voltage waveform having both AC and DC signal components is provided as input) or, if on, whether AC coupling is used (e.g., a capacitive filter is used to remove DC signal components from a voltage waveform) or DC coupling is used (e.g., the direct current component of a voltage waveform). A GUI input (e.g., a drop down menu, scroll or other search and selection button) 164 can be provided for scrolling through and selecting from among the plural options of coupling off, AC coupling, or DC coupling. A display area 166 indicates a Crest Factor, and a GUT input (e.g., a drop down menu, scroll or other search and selection button) 168 can be provided for selecting peak+ or peak- for the crest factor.

Figure 10:
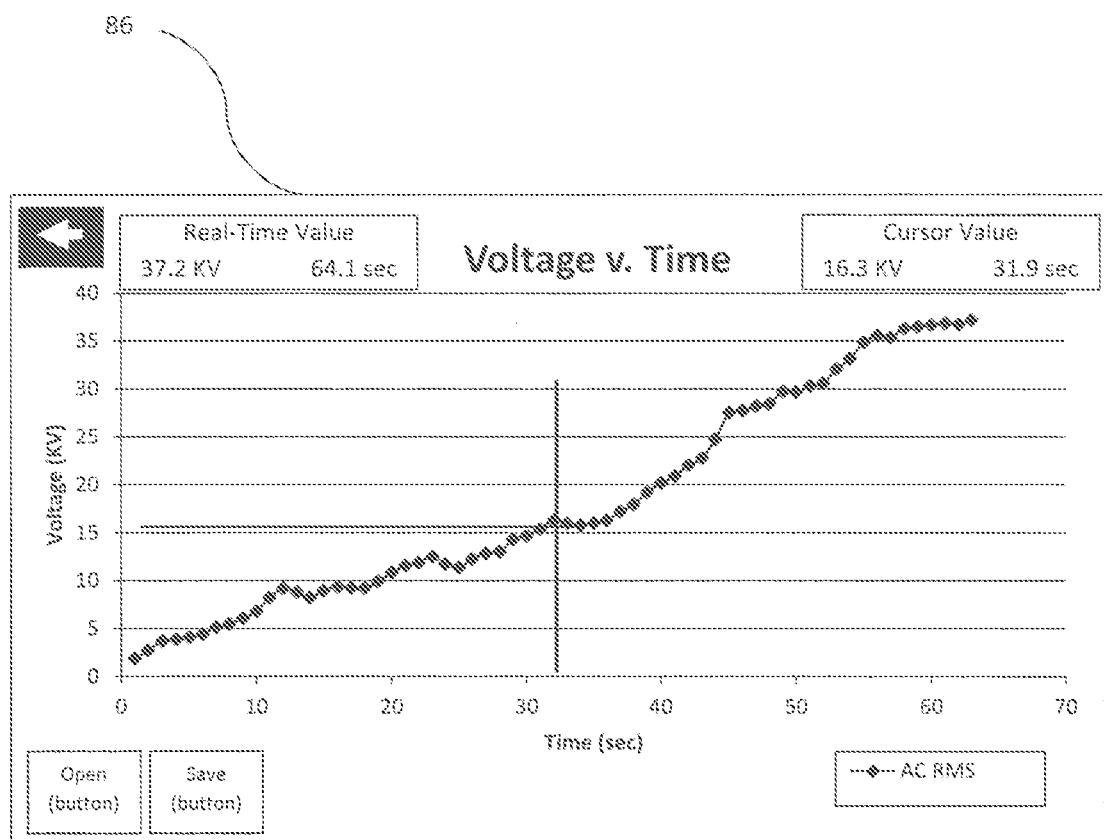
FIG. 10 depicts an illustrative screen on a graphical user interface of a wireless meter with display constructed in accordance with an illustrative embodiment of the present invention and operable in the voltage measurement system of FIG. 2.

As shown in FIG. 5, a display area 170 provides a graph of voltage over time for selected measurement data in the memory 84, and another GUI input 172 (e.g., a drop down menu, scroll or other search and selection button) provides a method for allowing a user to select a particular voltage measurement (e.g., AC RMS) based on the raw data. As stated above, the computed measurement values can be saved in the memory 84, for example, for the current continuous session and plotted in a graph indicating voltages over time on the display 86. The graph is, for example, displayed in real-time, but only one measurement shown plotted at a time. The user can select which measurement graph is displayed via the GUI input 172. If the graph is selected or clicked on or the user device 58 turned or rotated by the user, the voltage measurement application can, in response to a detected input or device 58 rotation, control the processing device 82 to generate the graph as a full screen on the display 86 in landscape orientation as shown in FIG. 10, for example, and as a graph which allows a user to select data points (e.g., via a GUI touchscreen input) and see corresponding values displayed. The processing device 82 can further generate other screens depending on which measurement type has been chosen to view, load previously saved graphs, and provide navigation GUI buttons (e.g., a "back" button to return to the main screen shown in FIG. 5).

As shown in FIG. 5, a Hold button 174, if pressed, takes the measurement value at that time (e.g., 23.2 kV for AC RMS in the example shown in FIG. 5) and displays it in the bottom right corner of the display screen. As stated above, a user can use the GUI button 172 to select another type of measurement to display as a graph of voltage over time in the display area 170. While in the example main screen illustrated in FIG. 5, the "Hold" value can be shown via the real-time graph by an x-cursor and intercepting y-cursor at the data point take when the hold button was pressed.

Figure 7:
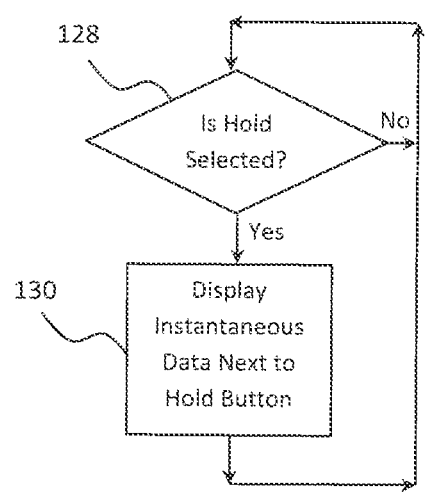

FIG. 7 illustrates a flow chart of example operations of the wireless voltage measurement application (hereinafter "app") on the processing device 82 in accordance with an illustrative embodiment of the present invention. The app controls the processing device 82 to periodically detect the status of the Hold button 174 (block 128). If the Hold button is selected, then the processing device 82 generates a display of the instantaneous data next to the hold button (block 130) as illustrated in display area 170 on the display 86 shown in FIG. 5; otherwise, it keeps detecting the status of the Hold button.

With continued reference to FIG. 5, by activating the Save button 176, the user can save the current session of data (e.g., the data currently being viewed on the display 86, or the data received during the current session of communication between the remote device 58 and the measuring device 52 currently providing raw measurement data). The File button 178 can be selected to obtain a listing of other stored historical raw measurement data or voltage measurement data. As stated above, the user device 58 can maintain a data log of stored raw measurement data and different types of voltage measurements generated from the raw data. For example, with 4 GB of FLASH memory, up to 48 hours of raw measurement data can be stored. Different parameters and profile data can be stored with the raw data or voltage measurements in the data log such as time and date of raw data capture and transmission, type of voltage measurement (e.g., ABS AVG, AC RMS, or other measurement), ID of corresponding measuring device 52, and optional name, location and/or identifier for device under test. The data log can be configured to permit a user to search and select raw measurement data captured within a designated data range and sorted/listed by device, time stamps, or other criteria. Voltage measurement data in the data log can also be selected and sorted, for example, based on measuring device identifier or time stamp of corresponding raw data. A first-in-first-out (FIFO) system can be used for managing stored data (e.g., store raw data or voltage measurement data until there is no more designated memory and automatically erase oldest data based on time stamp of raw data capture and transmission to the remote device 58).

In addition to the remote device 58 saving feature, the measuring device 52 also has the ability to log data as stated above. The measuring device 52 will continuously save the raw measurement data, regardless of the device status being in stand-by mode, or not transmitting to a paired remote device 58; it will automatically store the most recent 48 hours of test data into on-board memory. Other durations of storage can be used depending on memory size, cost and processing power constraints for a given voltage measurement application.

Figure 6:
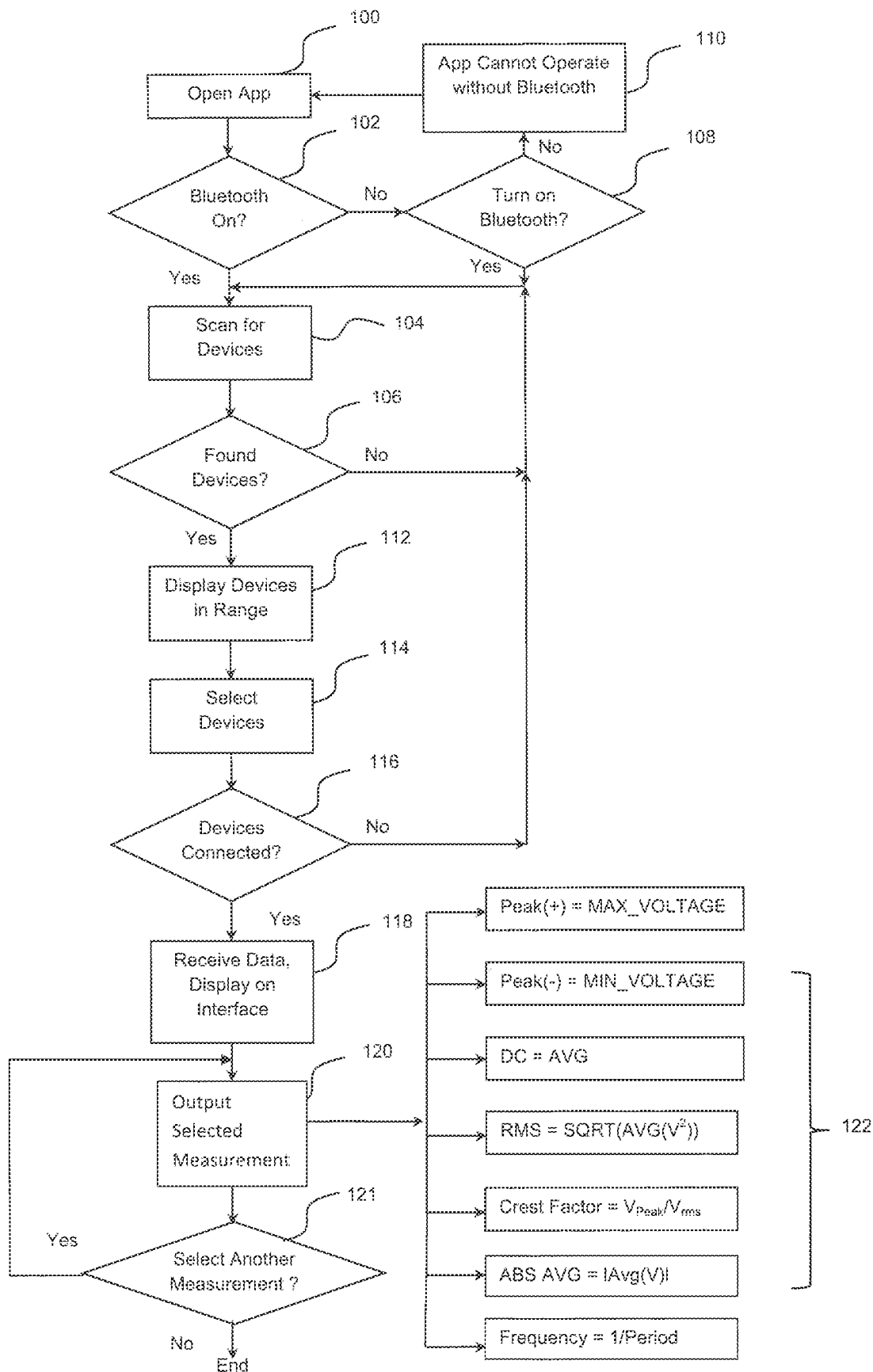
FIGS. 6 and 7 are flow charts of operations of the wireless meter with display of FIG. 4 in accordance with an illustrative embodiment of the present invention.

FIG. 6 illustrates a flow chart of example operations of the wireless voltage measurement application or "app" on the processing device 82 in accordance with an illustrative embodiment of the present invention. When the app is started and opened (block 100), it controls the processing device 82 to determine whether a Bluetooth® module is turned on (block 102). The Bluetooth® module (e.g., Bluegiga Technologies BLE112) is generally indicated in FIG. 4 by transceiver 80; however, it can be a separate module from the transceiver 80 such as if the transceiver 80 is for WiFi and both WiFi and Bluetooth® communications are to be supported by the remote device 58. If the Bluetooth® is not turned on (or, optionally, WiFi is not available), the app controls the processing device 82 to generate a prompt to the user to turn on Bluetooth® on the display 86 (e.g., "App cannot operate without Bluetooth®") (blocks 108 and 110), then it tries to re-start the app (block 102); if the Bluetooth® is turned on, then the processing device 82 starts to scan for devices in range (block 104). The range can be specified by the operational specifications of the Bluetooth® module, ZigBee® module or WiFi transceiver, for example. If the processing device 82 does not detect devices 52 within range, then it keeps scanning for devices 52 within range (block 106).

With continued reference to FIG. 6, the app configures the processing device 82 to display devices 52 (block 112). For example, the processing device 82 can control a GUI input 160 to generate a drop down menu or navigate to another screen on the display 86 that lists multiple measuring devices 52 such as the listing of discovered devices 52 on the display area 170 depicted in FIG. 8. The list can be dynamically populated with identifiers of measuring devices 52 detected to be within range of the remote device 58. Alternatively, the list can be partially pre-populated with a list of pre-designated measuring devices 52 and include a dynamically populated list of devices detected to be within range of the transceiver 80. If a user makes one or more device selections from the list (block 114), the pairing process between the transceivers 70, 80 of the selected measuring devices 52 and the user device 58 commences in accordance with the wireless communication protocol employed by the transceivers. The processing device 82 determines if the selected device(s) are connected (block 116). If the selected measuring device(s) 52 is not connected, then the processing device 82 generates a prompt to the user on the display 86 to turn on Bluetooth® (e.g., "App cannot operate without Bluetooth®") (block 110), then it tries to re-start the app (block 102) or similar actions for WiFi or other wireless protocol if used. If the selected measuring device(s) 52 is connected wirelessly to the remote device 58, then the processing device 82 receives raw measurement data from the device(s) 52 and displays data and other related information on the display 86 (block 118) as described above in connection with FIG. 5 in accordance with illustrative embodiments of the present invention. As described above, different types of voltage measurements (block 122) can be selected and output (blocks 120 and 121) by the user via GUI inputs on the display 86 and/or other optional user interface 90 or by default such as, for example:

Peak(+)=MAX_VOLTAGE;

Peak(−)=MIN_VOLTAGE;

DC=AVG;

RMS=SQRT(AVG($V^2$));

Crest Factor=$V_{Peak}/V_{rms}$.

In accordance with illustrative embodiments of the present invention, a remote device 58 can be configured to wirelessly connect to multiple measuring devices 52 and switch between which measuring device 52 is having its voltage measurement data displayed on the display 86. For example, if the measuring devices 52 and the remote device 58 are configured to communicate via Bluetooth®, their respective transceivers 70, 80 can implement a Bluetooth® stack (e.g., a piconet or scatternet) for multiple device communication and data capture. A remote device 58 can be programmed by the app to coordinate received raw measurement data transmitted wirelessly from multiple measuring devices 52 in range. For example, the transmitted signals from the multiple measuring devices 52 can comprise time stamps (e.g., implemented using Bluetooth® or other wireless communication protocol) and device identifiers (IDs) and/or names associated with the corresponding device 52 that sent the raw data. The remote device 58, in turn, can be programmed by the app to line up, or align, or compare or otherwise correlate received raw measurement data by time stamps provided in the Bluetooth® protocol or other protocol to ascertain a set of data per time stamp or designated time interval or window relative to a designated time stamp needed for performing a calculation of a selected voltage measurement type (e.g., wherein the data per time stamp or interval can involve data from a single measuring device 52 or plural measuring devices 52, depending on the requested voltage measurement type).

Raw measurement data, for example, can be received wirelessly as data comprising strings or sequences of values corresponding to time stamps for data capture, raw measurement data (e.g., measured voltages over time), and a measuring device 52 identifier. The serial protocol method (e.g., Bluetooth®) used for wireless communication of the raw measurement data from one or more measuring device 52 to the user device 58 facilitates handshaking or pairing of measuring device(s) to the user device 58, and sorting of the wirelessly transmitted data, since the protocol can define the start and end points (e.g., corresponding time stamps) of respective wirelessly transmitted sequences of data from the measuring device(s) 52 to the user device 58, as well as fields within the strings of values that can be parsed by the processing device in accordance with the app and protocol (e.g., to locate time stamps, the measuring device identifier, and the raw data). The selected wireless protocol also determines if data from measuring device(s) 52 is pushed to the remote device 58, or the remote device 58 polls the measuring devices 52 for raw data. By way of an example, each measuring device 52 can be controlled to send a ready-to-send signal to a paired remote device 58 when it has a data signal to send. The remote device 58 (e.g., acting as a master device) can be programmed to return a signal to that measuring device 52 indicating that the master device 58 is ready to receive. The measuring device 52, in turn, sends its data signal with raw measurement data, device identifier and time stamp for data capture and transmission. Alternative, as described below, the measuring devices 52 can be configured to broadcast or otherwise transmit raw measurement data (e.g., continuously) to the remote user device 58.

In the example of a multipoint measurement requiring data from plural measuring devices, with reference to FIG. 11, once paired with plural measuring devices 52 (step 180), the remote device 58 can be configured to respond to a user input (step 182) requesting a multipoint voltage measurement type by sending a message to the paired measuring device(s) 52 that raw data is needed. Alternatively, the measuring device(s) 52 can be configured to send messages with raw measurement data continuously or at designated intervals or time(s) to the remote device 58 regardless of the occurrence of a user input (step 182) for an voltage measurement type or not at the remote device 58. The user device 58 can, for example, provide each measuring device 52 with time synchronization information during pairing, or vice versa. In either case, the remote device 58 stores the raw measurement data received from the measuring device(s) 52 in memory.

For the example in FIG. 11, the wireless protocol can be configured to have the measuring devices 52 operate as slaves and notify the master remote device 58 with a ready-to-send message. When the master remote device 58 sends an acknowledgement or ready-to-receive signal to each of the measuring devices 52 indicating that it is ready to receive data (step 184), each measuring device 52 generates and sends to the remote device 58 a time-stamped message comprising raw measurement data (block 186). The remote device 58 is programmed, for example, to align raw data from respective measuring devices 52 relative to a selected time stamp or point in time in order to determine, for example, the selected multipoint voltage measurement. The measuring devices 52 need not be precisely synchronized (e.g., to the same clock), that is, the differences between their respective time stamps for sending data for the same test can be on the order of a few microseconds but is negligible due to the averaging of test data over time. Thus, a degree of tolerance exists for a window of time around the start times of raw measurement data transmissions from plural measuring devices 52 for the same test or voltage measurement type.

In accordance with another illustrative embodiment of the present invention and with reference to FIG. 12, once the user device 58 commences pairing with the measuring devices 52 (block 190), each of the measuring devices 52 sends a time synchronization (block 194) based upon its internal clock, for example. Once pairing is complete, the continuous broadcasting of data from each measuring device 52 to the remote device 58 can commence (block 196). The remote device 58 can, in turn, receive data from each of the measuring devices 52 and perform and display a measurement type (block 198) selected via the user interface of the remote device 58 (block 192). Alternatively, the user device 58 can be programmed to send time synchronization information (block 194) to each measuring device 52 with which it is paired. The remote device aligns received raw measurement data from the measuring devices 52 based on the original time synchronization from each device 52.

With reference to FIGS. 3 and 8, an LED 76 (e.g., a multicolor LED) can be provided on the voltage measurement and wireless PCB 56 and be viewable from the outside of the measuring device 52 (e.g., via a light pipe disposed within the housing that encloses the voltage measurement and wireless PCB 56 at the base of the voltage divider 54). The LED 76 is controllably illuminated by the microprocessor 64 to indicate different conditions such as whether a wireless connection or pairing between the user device 58 and that measuring device 52 exists or not, whether the transceiver 70 of the measuring device 52 is currently transmitting data to the user device 58, and/or an identifying color or flash/blinking interval of the measuring device 52. The LED 76 is helpful to a user operating a remote user device 58 since the user can tell from a distance away from the measuring device 52 that it is currently paired with the user device 58. For example, illumination of the LED indicates that the transceiver 70 of the measuring device 52 is currently paired with the user device 58. If the LED 76 is not illuminated, the user is then aware that the measuring device 52 is not paired with the user device 58 successfully for wireless communication. In addition, the microcontroller 64 can be programmed to control the LED to blink or flash to indicate that the paired measuring device 52 is currently transmitting data to the user device. Further, the LED 76 can be combined with or replaced by a sound generating device (not shown) on the voltage measurement and wireless PCB 56. For example, the sound generating device can be controlled by the microcontroller 64 to generate audio signals to indicate to the user one or more of different conditions such as whether a wireless connection or pairing between the user device 58 and that measuring device 52 exists or not, whether the transceiver 70 of the measuring device 52 is currently transmitting data to the user device 58, and/or an identifier for the measuring device 52.

With continued reference to FIG. 8, if the LED 76 is a multicolored LED, microcontroller 64 can be programmed to control the LED to illuminate a specified one of plural colors to distinguish the measuring device 52 from another measuring device 52 which has an LED controlled to illuminate a different color. A multicolor LED 76 is helpful to a user operating a remote user device 58 for a multipoint measurement (i.e., using plural measuring devices 52 at respective multiple test points) since the LEDs 76 on the plural measuring devices 52 can be illuminated differently to distinguish them. In addition, as shown in FIG. 8, the listing of the selected measuring devices 52 and/or their respective data can be shown in their respective colors (i.e., using the same colors as their corresponding LEDs) on the screen 170 to further help a user distinguish among the measuring devices 52 during a multipoint test or measurement. The user device 58 can be programmed to instruct the selected measuring devices 52 as to which LED color to use during or after pairing.

In addition to the LEDs 76 on the measuring devices and color coordinated information and data in the listing of selected measuring devices 52 on the screen 170, the user device 58 can be programmed to display data from plural measuring devices 52 simultaneously (e.g., phase angles calculated from received raw data from respective measuring devices 52), as well as show different types of voltage measurement data on the same screen at the same time. These functions are therefore advantageous over conventional analog voltage meter heads that are only able to determine and display one type of voltage measurement data at a time based on raw data from one measuring device 52.

Figure 9:
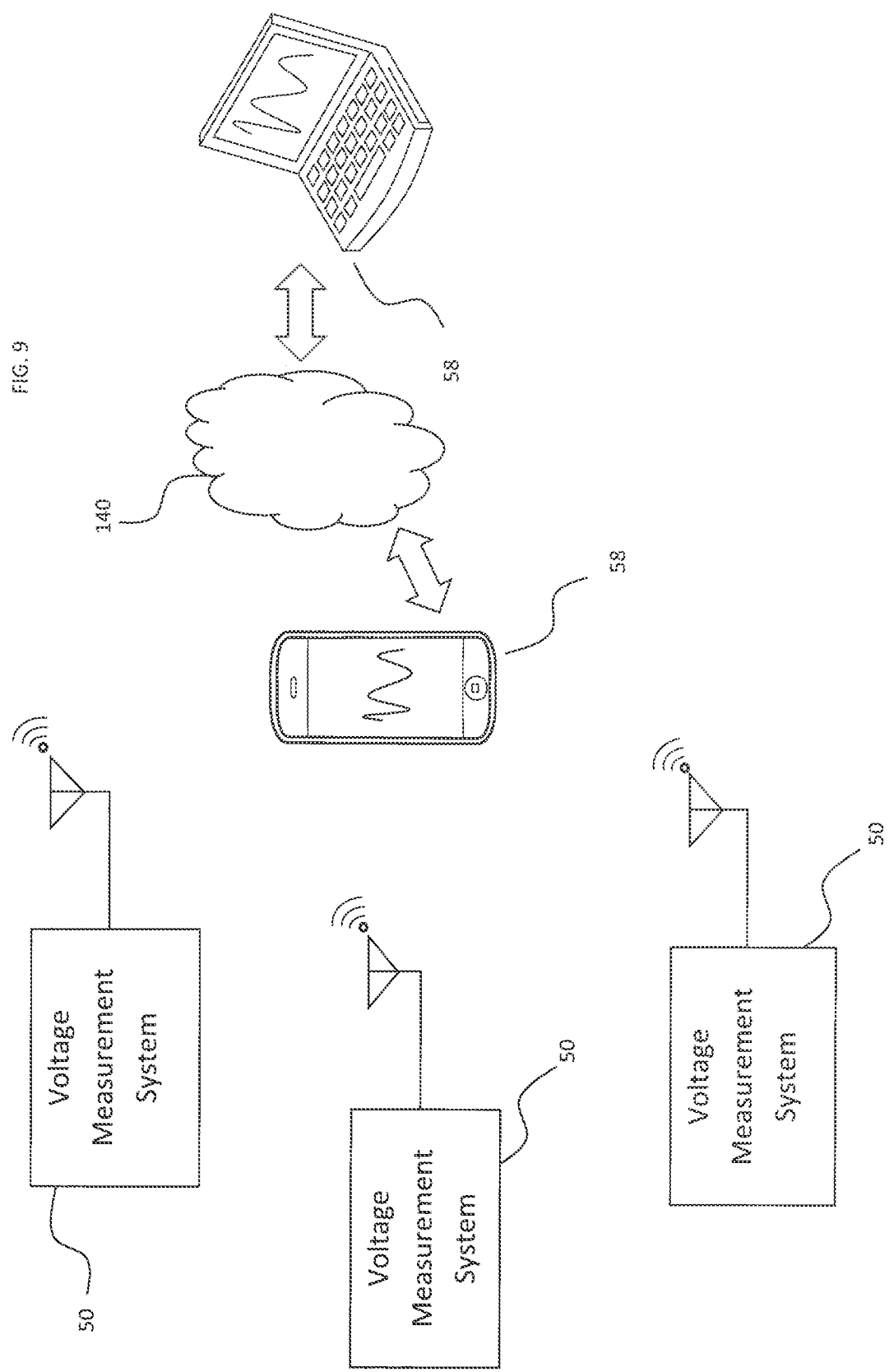
FIG. 9 depicts a plurality of voltage measurement devices of FIG. 2 deployed at respective test points and operating in conjunction with a computer for logging measurement values in accordance with an illustrative embodiment of the present invention.

FIG. 9 depicts another example arrangement of a remote device 38 receiving raw data from multiple voltage measurement systems 50 (e.g., three devices under test 18 such as three conductors in a three-phase power system that are each connected to a different measuring device 52 via a voltage divider 54). It is to be understood that the multiple measuring devices 52 need not be at different devices under test 18 but rather at different test points on a single device under test 18 such as the primary and secondary windings of a power transformer under test. The remote device 58 can in turn communicate with other devices (e.g., not just other remote devices or meter heads 58, but servers and general purpose computing devices) via another network 140 (e.g., via the internet or a cellular network).

The improved system and method for voltage measurements described herein in accordance with illustrative embodiments of the present invention provide a digital kilovoltmeter, for example, that is highly accurate, portable voltage measurement system that is useful for voltage measurements peaking at high voltage ranges such as 100-500 kV unlike conventional digital multimeters that are only useful for lower voltage measurements. The voltage measurement system 50 constructed in accordance with embodiments of the present invention is programmed and configured to be traceable to National and International standards (NIST) for significant cost savings on outside calibrations. The voltage measurement system 50 can comprise a voltage divider assembly (e.g., a measuring device 52 with voltage divider 54) operated in conjunction with a remote device 58 that can be configured as a precision readout device calibrated to ±1% for AC and ±0.5% for DC for up to 400 kV, for example. The voltage measurement system 50 can be stored and transported in a durable carrying case and interconnection leads with a remote device 58, or the remote device can be transported separately. The carrying case and battery operation make the system 50 completely portable for field and factory testing, while the precision divider assembly 52 and readout device 58 make it suitable for laboratory use. Different applications can be, but are not limited to, calibration laboratories, production testing and field service testing such testing and calibrating of AC/DC Hipot testers, high voltage DC power supplies, semiconductor implantation systems, insulation testers, motors, three-phase power systems, and power transformers, and other utility and substation components that require testing, among other applications.

Illustrative embodiments of the present invention have been described with reference to operations at a programmable device such as a portable measuring device 52 having a voltage measurement and wireless PCB 56, and a handheld remote device 58 with display which can be a mobile phone, laptop, tablet or other user device. It is to be understood, however, that the present invention can also be embodied as computer-readable codes on a computer-readable recording medium. The computer-readable recording medium is any data storage device that can store data which can thereafter be read by a computer system. Examples of the computer-readable recording medium include, but are not limited to, read-only memory (ROM), random-access memory (RAM), CD-ROMs, DVDs, magnetic tapes, floppy disks, optical data storage devices. It is envisioned that aspects of the present invention can be embodied as carrier waves (such as data transmission through the Internet via wired or wireless transmission paths). The computer-readable recording medium can also be distributed over network-coupled computer systems so that the computer-readable code is stored and executed in a distributed fashion.

The components of the illustrative devices, systems and methods employed in accordance with the illustrated embodiments of the present invention can be implemented, at least in part, in digital electronic circuitry, analog electronic circuitry, or in computer hardware, firmware, software, or in combinations of them. These components can be implemented, for example, as a computer program product such as a computer program, program code or computer instructions tangibly embodied in an information carrier, or in a machine-readable storage device, for execution by, or to control the operation of, data processing apparatus such as a programmable processor, a computer, or multiple computers. A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a communication network. Also, functional programs, codes, and code segments for accomplishing the present invention can be easily construed as within the scope of the invention by programmers skilled in the art to which the present invention pertains. Method steps associated with the illustrative embodiments of the present invention can be performed by one or more programmable processors executing a computer program, code or instructions to perform functions (e.g., by operating on input data and/or generating an output). Method steps can also be performed by, and apparatus of the invention can be implemented as, special purpose logic circuitry, e.g., an FPGA (field programmable gate array) or an ASIC (application-specific integrated circuit).

Processors suitable for the execution of a computer program include, by way of example, both general and special purpose microprocessors, and any one or more processors of any kind of digital computer. Generally, a processor will receive instructions and data from a read-only memory or a random access memory or both. The essential elements of a computer are a processor for executing instructions and one or more memory devices for storing instructions and data. Generally, a computer will also include, or be operatively coupled to receive data from or transfer data to, or both, one or more mass storage devices for storing data, e.g., magnetic, magneto-optical disks, or optical disks. Information carriers suitable for embodying computer program instructions and data include all forms of non-volatile memory, including by way of example, semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in special purpose logic circuitry.

The above-presented description and figures are intended by way of example only and are not intended to limit the present invention in any way except as set forth in the following claims. It is particularly noted that persons skilled in the art can readily combine the various technical aspects of the various elements of the various illustrative embodiments that have been described above in numerous other ways, all of which are considered to be within the scope of the invention.

The invention claimed is:

1. A system for voltage measurement and wireless communication, the system comprising:
   a voltage divider connected to a device under test (DUT) and configured to step down voltage signals from the DUT peaking at least at 100 kilovolts (kV) or above to lower voltages on the order of +/−100V; and
   measuring devices connected to the voltage divider for receiving raw measurement data comprising stepped down voltage signals from the voltage divider, each of the measuring devices comprising a processing device and wireless transceiver, the processing device configured to condition the stepped down voltage signals for wireless transmission via the wireless transceiver as wirelessly transmitted signals; and
   a remote device configured for remote operation from the measuring devices and the voltage divider, the remote device comprising a remote processing device, a remote transceiver, a user interface, and a display, the remote processing device configured to
   control the remote transceiver to communicate with the transceiver in the measuring device to receive the wirelessly transmitted signals, the received signals comprising the raw measurement data,
   store the raw measurement data,
   operate the user interface to receive user inputs to select from among a plurality of voltage measurement options,
   process at least a selected portion of the raw measurement data to determine the voltage measurement that corresponds to the selected voltage measurement option, and
   output the voltage measurement on the display;
   wherein the remote device is configured to receive signals from the measuring devices, and each of the measuring devices comprises a visual indicator that is operated to illuminate when that measuring device is paired with the remote device for wireless communication and to discontinue illumination when that measuring device is not paired with the remote device for wireless communication.

2. The system of claim 1, wherein the transceiver and the remote transceiver are configured to communicate using at least one of ZigBee®, Bluetooth® and WiFi.

3. The system of claim 1, wherein the remote device is configured to determine when one or more of the measuring devices is within a designated wireless communication range.

4. The system of claim 1, wherein the wirelessly transmitted signals comprise at least an identifier corresponding to the respective one of the measuring devices, the remote device configured to store the raw measurement data in the received signals in a memory device such that it is attributed to the measuring device assigned the identifier.

5. The system of claim 4, wherein the wirelessly transmitted signals are associated with a time stamp, one of the plurality of voltage measurement options uses the raw measurement data transmitted from selected ones of the measuring devices, and the remote processing device is configured to determine which raw measurement data corresponds to the selected ones of the measuring devices for at least one of a selected period of time or initiation of a selected voltage measurement using the time stamps and identifiers.

6. The system of claim 1, wherein the plurality of voltage measurement options is selected from the group consisting of absolute average (ABS AVG), alternating current (AC) root mean square (RMS), peak+voltage, peak−voltage, frequency, phase angle, AC coupling, and direct current (DC) coupling.

7. The system of claim 1, wherein the remote processing device is configured to determine when at least one of the measuring devices is within range to receive signals therefrom via the remote transceiver, and to display all of the measuring devices determined to be within range.

8. The system of claim 7, wherein the user interface is configured to allow a user to select one or more of the displayed measuring devices determined to be within range.

9. The system of claim 7, wherein the remote processing device is configured to display at least one of raw measurement data and a voltage measurement for each of the measuring devices on the display.

10. The system of claim 1, wherein the visual indicator is a multicolor indicator that is controlled to illuminate a selected color, and the visual indicators of the measuring devices are controlled to illuminate different colors.

11. The system of claim 10, wherein the display of the remote device outputs at least one output chosen from an identifier, raw measurement data, and an voltage measurement corresponding to at least one of the measuring devices using its respective one of the different colors.

* * * * *